United States Patent
Narayanaswamy et al.

(10) Patent No.: US 9,507,896 B2
(45) Date of Patent: Nov. 29, 2016

(54) QUASI-DYNAMIC SCHEDULING AND DYNAMIC SCHEDULING FOR EFFICIENT PARALLEL SIMULATION

(71) Applicant: Synopsys, Inc., Mountain View, CA (US)

(72) Inventors: Ramesh Narayanaswamy, Palo Alto, CA (US); Paraminder S. Sahai, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 94 days.

(21) Appl. No.: 13/889,096

(22) Filed: May 7, 2013

(65) Prior Publication Data

US 2013/0297279 A1    Nov. 7, 2013

Related U.S. Application Data

(60) Provisional application No. 61/643,477, filed on May 7, 2012.

(51) Int. Cl.
*G06F 17/50* (2006.01)
(52) U.S. Cl.
CPC ....... *G06F 17/5036* (2013.01); *G06F 17/5022* (2013.01)
(58) Field of Classification Search
CPC .................... G06F 17/5036; G06F 17/5022

USPC ...................................................... 703/13, 14
See application file for complete search history.

(56) References Cited

U.S. PATENT DOCUMENTS 6,345,379 B1 * 2/2002 Khouja ............... G06F 17/5022
716/115

OTHER PUBLICATIONS

Harris, M. et al., "Parallel Prefix Sum (Scan) with CUDA," GPU Gems 3—Chapter 39, Nguyen, H. (ed.), 2008 NVIDIA Corporation, Addison-Wesley, 28 pages.

* cited by examiner

*Primary Examiner* — Saif Alhija
(74) *Attorney, Agent, or Firm* — Fenwick & West LLP

(57) ABSTRACT

An approach for simulating an electronic circuit design uses the influence of a set of input changes of regions of the circuit design to schedule which levels within regions of a circuit should be simulated. The state of one or more inputs of one or more regions of the circuit design is checked to determine if inputs to these regions changed. For each input having an input change, a logic level depth associated with the input is computed. Using the computed logic levels, a maximum logic level depth of the one or more regions is computed for a set of input changes. Thus, for each region that has an input with a state indicating an input change, simulation may be scheduled for first logic level through and including the determined maximum logic level in each region of the circuit design in parallel.

14 Claims, 3 Drawing Sheets

QUASI-DYNAMIC SCHEDULING AND DYNAMIC SCHEDULING FOR EFFICIENT PARALLEL SIMULATION

CROSS REFERENCE TO RELATED APPLICATION

This application claims priority under 35 U.S.C. §119(e) from co-pending U.S. Provisional Patent Application No. 61/643,477, filed on May 7, 2012, which is incorporated by reference herein in its entirety.

BACKGROUND

1. Technical Field

The present disclosure relates to dynamically scheduling parallel simulation of different regions of an electronic circuit design.

2. Description of the Related Arts

Logic simulation of multi-core computing systems continues to become more complex and more important in the overall design process. Parallel logic simulation techniques claim to increase the performance of simulation task by taking advantage of concurrent read-write access of VLSI systems. Simulation of logic designs at gate, register transfer, and behavioral level of physical abstraction can employ different techniques, such as event driven and oblivious Parallel logic simulation techniques, like parallel event driven simulation, employ multiple time-ordered queues and partitions, and assign sections of a design into a time-ordered queue running on a processor. Generally, event driven simulation maintains a time ordered queue. Components with value changes are inserted into the queue which limits the computation to parts of the design that have to be updated. To operate properly, the time ordered queues need to be synchronized. Parallel event driven simulation, however, does not scale well beyond four or eight processors in practice. Synchronization cost between hundreds of processors can be very high and at each time step and each level of the logic under test. Moreover, the simulation work assignment may not be distributed evenly among the processors performing the simulation.

Other parallel logic simulation techniques, like oblivious simulation, evaluate all components of the logic design under test. That is, a component of the logic design is evaluated whether or not it has a value change or not. And in turn, the computation of a component is simpler compared to parallel event driven simulation because a value change of a component is not checked, and queue insertion is not performed. In further contrast to parallel event driven simulation, parallel oblivious simulation does not suffer work starvation in processors. Synchronization can be simpler since a single synchronization per level of the model is sufficient. Parallel oblivious simulation, however, may be less efficient for certain simulation task because parallel oblivious simulation performs redundant computation. For example, in cases where the number of value changes per design clock is low, parallel oblivious simulation is slower than serial event driven simulation.

SUMMARY

Embodiments include an approach for simulating an electronic circuit design based at least in part on a computation of the influence of a set of input changes of regions of the circuit design. In one embodiment, the state of one or more inputs of one or more regions of the circuit design is checked to determine if inputs to these regions changed. For each input having an input change, a logic level depth associated with the input is computed. Using the computed logic levels, a maximum logic level depth of the one or more regions is computed for a set of input changes. Thus, for each region that has an input with a state indicating an input change, simulation may be scheduled for first logic level through and including the determined maximum logic level in each region of the circuit design in parallel.

The features and advantages described in the specification are not all inclusive and, in particular, many additional features and advantages will be apparent to one of ordinary skill in the art in view of the drawings and specification. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments of the present disclosure can be readily understood by considering the following detailed description in conjunction with the accompanying drawings.

DETAILED DESCRIPTION OF EMBODIMENTS

The Figures (FIG.) and the following description relate to preferred embodiments of the present disclosure by way of illustration only. It should be noted that from the following discussion, alternative embodiments of the structures and methods disclosed herein will be readily recognized as viable alternatives that may be employed without departing from the principles of the present disclosure.

Parallel simulation, as referred to herein, executes a region consisting of one or more clocked regions by level. Each level is checked to determine whether any logic input of that level has an input change, and within in each level, each Aggregated Block is checked for a change to any input of the aggregated block. If the input change is true, the level and aggregated block is executed. The parallel simulation methods and systems of the disclosed embodiments are more efficient than other parallel simulation techniques because the levels, primitives, or aggregated blocks with an input change value true may be scheduled for execution and the levels, primitives, and aggregated blocks with an input change value false are not scheduled for simulation.

Creating a Simulation Model

In one implementation, a simulation model may be an interconnection of simple primitives. Simple primitives have roughly equal compute work, and communication requirements. The description of a logic design at gate level is commonly in terms of simple primitives such as and/or gates, flip flops, latches, etc. Register transfer level (RTL) and higher level descriptions can be decomposed into simple primitives such as adders, multipliers, multi-bit and/or, selectors, multi-bit flip flops, latches, etc.

Figure 1A:
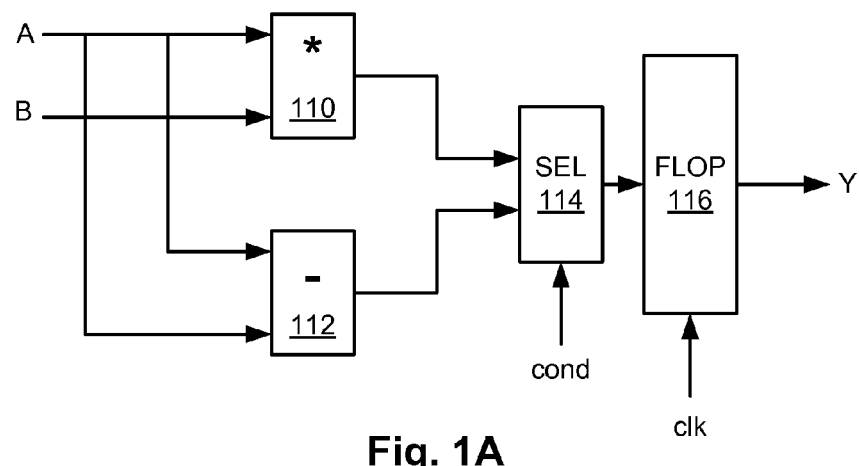
FIG. 1A is a simulation model of a circuit design, according to one embodiment.

For example the following RTL Description in Verilog HDL of the logic element shown in FIG. 1A can be decomposed into primitives.

```
always @(posedge clk)
    if(cond)
        Y = A * B;
    Else
        Y = A - B;
```

Decomposing RTL and higher level descriptions into primitives is generally known by those of ordinary skill in the art of logic circuit design. A description of a logic design may include hundreds of thousands of such statements. Primitives such as multipliers 110, subtractors 112, adders, etc. of an arbitrary width can be decomposed into components that have a fixed width such as 32 or 64 bits. Primitives such as selectors 114 that have arbitrary number of inputs can be decomposed into components that have a fixed number of inputs such as 3 or 5. Primitives may be combined with registers, such as flop 116 to execute logic functions as shown in FIG. 1A. Generally, an HDL description may be decomposed into simple primitives with suitable number of inputs, widths, and complexity of operation.

Creating a Simulation Sequence

In an embodiment, a simulation sequence triggers evaluation of one or more primitives based on input changes that can result in updating the values at the outputs of the primitives. For the example below one can construct the following simulation sequence.

Change On (A, B, or cond) Evaluate Region R1
    Change On (posedge clk) Evaluate Region R2
    An alternate sequence is—
    Change On (A, or B) Evaluate Region R11
    Change on (p, q, or cond) Evaluate SEL
    Change on (posedge clk) Evaluate Region R2

Figure 1B:
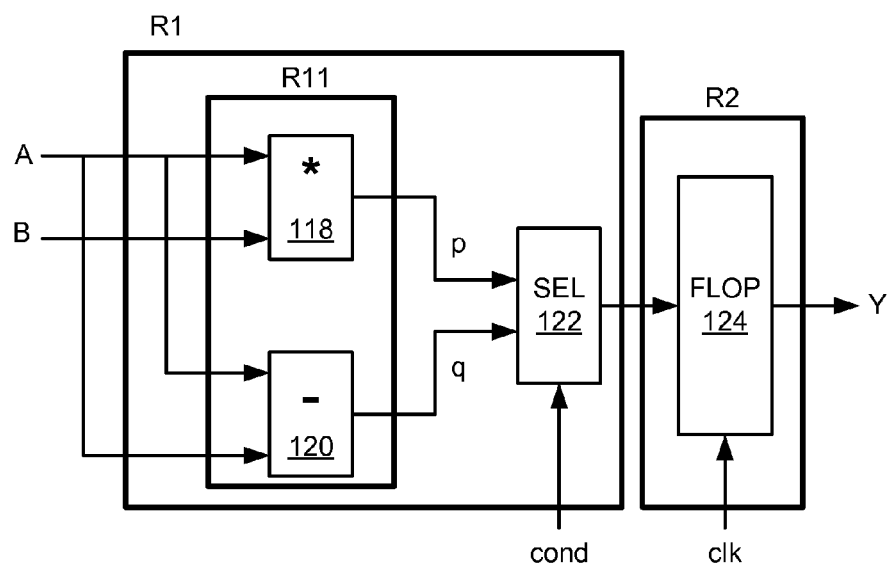
FIG. 1B is another simulation model of a circuit design, according to one embodiment.

Simulation sequences for a design are formed to create regions large enough to keep a parallel machine busy but not so large that unnecessary checking or execution is minimized. If a design has multiple clocks regions that correspond to each clock's flip flops/latches, the primitives that produce the inputs to the flip flops/latches can be formed into regions as shown in FIG. 1B. A first region R1 includes the primitives multiplier 118 and subtractor 120, which are included in region R11, and selector 122. The output of selector 122 forms the input to flip flop 124 included in region R2. In cases where a combinational cycle exists in the design an additional sequence can be incorporated by adding the following statement to the simulation sequence while(value change in the design region encompassing the
        combinational cycle) {Evaluate all regions that encompass the combinational cycle}

Selective Evaluation of a Region

In one example embodiment, a region comprises an interconnection of primitives which forms a hypergraph. A typical region is acyclic. In case a region has a combinational cycle the cycle is cut at an arbitrary point and a special primitive in a special region is inserted. This turns all regions into acyclic hypergraphs.

Figure 1C:
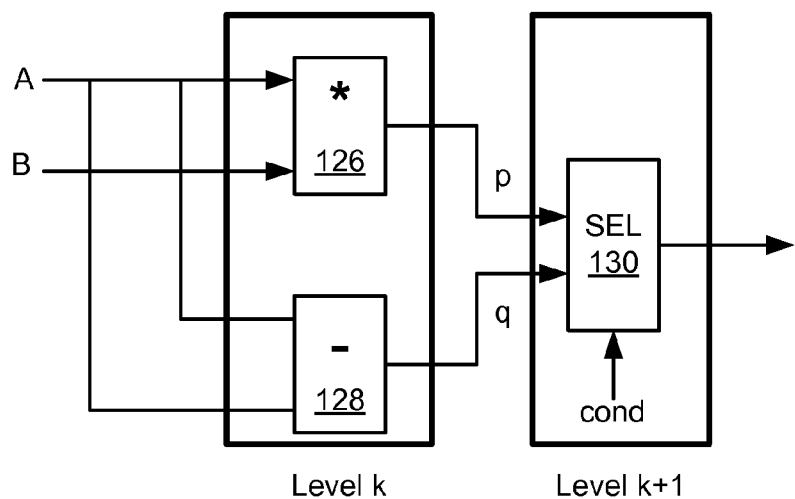
FIG. 1C is another simulation model of a circuit design, according to one embodiment.

An acyclic hypergraph can be levelized where each level has a set of primitives which do not have value dependencies. For example, as shown in FIG. 1C, in the levelized hypergraph below, the multiplier 126 and substractor primitives 128 do not have value dependency. The SEL primitive 130 included in level k+1 has value dependency on multiplier 126 and subtractor 128 primitives that are included the previous level k.

An example procedure for selective evaluation of a region is as follows:

```
For Level l = 0 to Last Level {
    if l has input change True {
        Reset input change of l;
        foreach Primitive p in l {
            Schedule it to a processor
        }
        Wait for all outputs to be written; // synchronization
    }
}
```

An example procedure for primitive evaluation is as follows:

```
If P has Input Change True {
    Reset input change of P;
    Read Inputs;
    Evaluate Operation of P to produce output value New Value;
    if(New Value != Old Value) {
        For each Primitive Q which depends on output of P {
            Set Input Change of Q's Level to True;
            Set Input change of Q to True;
            Write New Value to Q's input location;
        }
    }
}
```

This procedure avoids time/event ordered queues and synchronization of the queues. Additionally, there is a single synchronization for each level.

Aggregated Selective Evaluation

Figure 1D:
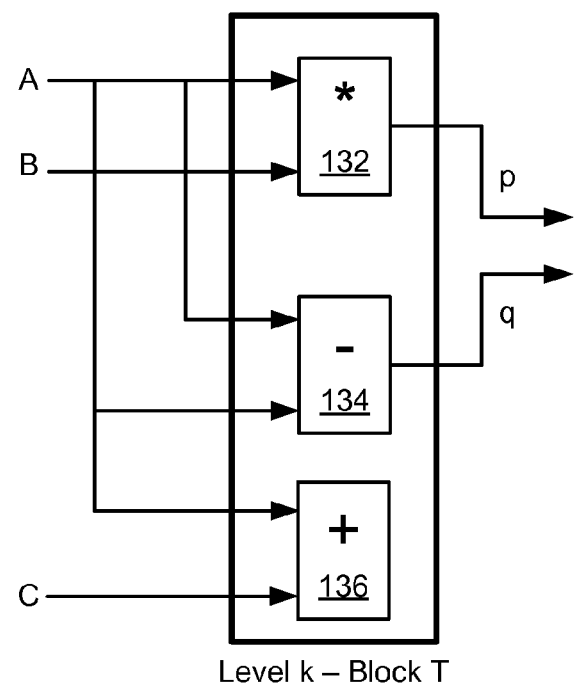
FIG. 1D is another simulation model of a circuit design, according to one embodiment.

The selective evaluation procedure above allows input change to be maintained for each primitive. By grouping a set of primitives in a level that share inputs into a block a single common input change value can be maintained for a group of primitives. In the example below, and as shown in FIG. 1D, a single common input change value can be maintained for the block that contains the multiplier 132, subtractor 134, and adder 136 primitives. When any input signals A, B, or C change the common input change value of the block will be set. When any of input signals A, B, or C change all the primitives in the block will be evaluated. An aggregated block may, in turn, be scheduled to a cluster of processors.

An example procedure for Evaluating an Aggregated Block on a cluster with k processors is as follows:

```
If Block T has Input change {
    foreach processor {
        Fetch (Total Inputs / k) to fast local memory from global memory;
        wait for the cluster to complete fetches;
        foreach assigned primitive {
            fetch primitive's operation, location of inputs, old value
        evaluate the primitive to produce new result value
        if(new result value is different from old value) {
            write output change value, and output value to local memory;
            update old value to the new result value;
        }
    }
}
wait for the cluster to complete writes;
For each of assigned set of outputs {
    if there is a output change {
        write output value to every aggregate block that reads this
```

```
            output and set the input change value for that aggregate
            block;
        }
}
```

This procedure balances the workload in three phases, fetching of input values, evaluation of primitives, and checking and writing output changes. This procedure also optimizes memory access by fetching input values for the aggregate block as a single contiguous region of memory. This procedure reduces redundant evaluation compared to oblivious simulation.

Optimizing for Memory Architecture

Global or system memory has high bandwidth that is fully utilized when clusters of processors write or read from adjacent locations. Memory bandwidth is conserved if a value read is used by all primitives that may require it. Memory bandwidth is conserved if a computed output value of a primitive is written to the fewest locations, preferably one location.

These objectives can be met if an evaluation region is partitioned into sub regions subject to the following constraints.

- Minimize signal crossing between sub regions—most values will be produced and consumed within a sub region, when a signal crosses sub regions many consumers of the signal will be moved to the receiving sub region
- Keep number of primitives each sub region roughly equal sized
- Keep number of primitives in each level of each sub region roughly equal sized Such partitions can be obtained by applying multi constraint partitioning algorithms known to those of ordinary skill in the art of performing simulation of circuit designs. These algorithms can optimize for any well defined efficiently computable property. For instance, the number of primitives in a sub region that belong to a level L is efficient to compute and maintain. With this information the number of primitives from level L can be optimized to be roughly equal sized in each sub region. The same method can be applied to all levels of the model.

In each level each partitioned sub region is an aggregated block which has a minimized collection of input values. By allocating adjacent locations in memory to the input values of the aggregated block, the input value reads are optimized for memory bandwidth. Output values written from sub region S1 to sub region S2 will be assigned to adjacent locations to optimize for memory bandwidth. The overall approach helps to ensure that input value reads are done in a large block per sub region. Output value writes by a sub region will be fragmented smaller blocks because the output value writes will go to many sub regions. In one embodiment, given the choice between a single large input block or a single large output block, a single large input block is preferred. Since output changes at a low frequency and output writes happen on a change fragmented writes don't have a high cost. Single block read occurs on any input change to the region, and is fully optimized.

Exploiting SIMD Instructions

A processor cluster or a sub cluster may support single instruction, multiple data (SIMD) instructions. A SIMD instruction can efficiently compute 8/16/32 operations of the same primitive type; for example, sixteen addition operations in a single clock cycle of the CPU. To exploit SIMD instructions, a single primitive type or a small set of primitive types can be allocated to a cluster or sub cluster. The number of primitive types in a sub region can be reduced by the following means:

- Limit the number of primitive types in model creation to the minimum required
- Add a constraint to the multi constraint partitioner to minimize number of primitive types in each sub region. The number of primitive types in each sub region can be efficiently computed by means of a hash table in primitive type names to enable multi constraint partitioning
- In each level of a sub region sort the primitives by type to create small primitive type groups that can be implemented as SIMD instructions The number primitive types in a cluster or sub cluster is further reduced by limiting the model generation to a small number of primitives.

Improving Change Locality

Aggregate selective evaluation evaluates all the primitives in a block even if one input to the block has changed. It is desirable to have many primitives that change at the same simulated time in a single block to improve the efficiency of aggregate selective evaluation. In a design model, the same component may be used multiple times. By way of example, an eight core CPU will have eight usages of the component core. A primitive that performs an operation in core will appear eight times in CPU. For example, an incrementer that increments program counter by 1 in a core will appear eight times in CPU, say Incr_0, Incr_1, . . . , Incr_7. These groups of primitives are referred to herein as sibling primitives. Sibling primitives have a high probability of having input changes at the same time.

The Design model of CPU will be a netlist of primitives. This netlist can be pre-processed to cluster sibling primitives into single meta primitives. This pre-processed netlist can then be partitioned for Memory locality and SIMD clustering. This pre-clustering ensures that (a) sibling nodes that are likely to change at the same simulated time are in the same block, and (b) more primitives of the same type are grouped into a block thus improving SIMD instruction usage.

Improving Utilization of a Parallel Architecture

A simulation model can be partitioned into running partly on a CPU and partly in a attached massively parallel architecture such as graphic processing unit (GPU). An example of the execution sequence of the simulation model may alternate between CPU and GPU. The number of independent primitives available in each level of the model determines the parallel efficiency of the GPU. A user typically runs thousands of tests on a single simulation model. Each of these tests forms an execution sequence as previously discussed.

By creating a simulation model that can run 2/4/ . . . copies of the simulation model at a time we can increase parallel efficiency of the model and achieve better utilization of the model.

The multi test simulation model is constructed in the following manner:

- A single copy of the simulation model program
- 2/4/ . . . copies of the simulation model data, one for each test to be supported by the multi test simulation model The multi test simulation model is constructed in the following manner:

- A single copy of the simulation model program
- 2/4/ . . . copies of the simulation model data, one for each test to be supported by the multi test simulation model The multi test simulation model is orchestrated as multiple tests, where the CPU portion of each test is a logical process, and a GPU server process provides the execution of GPU portion of all tests. In one example, a multi test model combines four tests at a time. In this example, the CPU portion of test0, test1, test2, test3 will execute. When each of test0-3 require GPU execution each CPU portion sends a request to the GPU Server.

Figure 2:
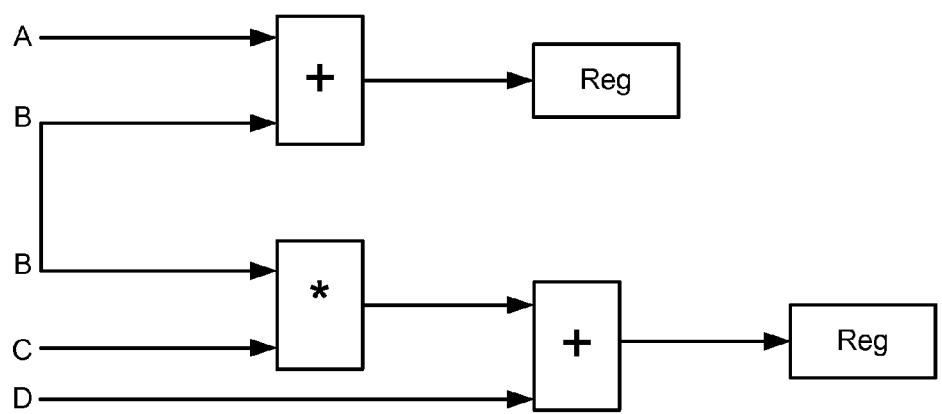
FIG. 2 is another simulation model of a circuit design, according to one embodiment.

The GPU Server can implement one of many scheduling policies for executing the GPU requests:
1) wait for all four requests to arrive and launch a four wide simulation model to compute all four results
2) wait for at least two requests to arrive and launch a two wide simulation model
3) wait for a finite short duration and launch all available requests with required width of simulation model; this can be 1/2/4 wide Quasi-Dynamic Scheduling In one embodiment, the execution of a region for simulation is triggered by one or more input changes. In FIG. 2 the region will be executed on any change of A, B, C, or D. On an input change the last reachable level from the input change can be computed by a depth first walk of the graph from the input and maintaining the highest level number of all primitives reached by the depth first walk. In FIG. 2, a change on A reaches level 1 and a change on B reaches level 2. When a set of inputs change, the maximum logic level depth is the maximum of the last reachable levels for the set of inputs. In FIG. 2, if A and B change the maximum logic level depth is max(1, 2)=2. The last reachable level for each input can be computed at compile time. On a set of input changes the maximum logic level depth for the change set can be computed. The execution region can be scheduled for the level 1 hru maximum level. If inputs A and B change level 1 thru 2 will be scheduled. If input A changes the maximum level is 1, and only level 1 is scheduled. By dynamically scheduling the necessary levels as determined by the input changes unnecessary execution of levels is saved.

Dynamic Scheduling

In one embodiment, dynamic scheduling of a level allows for an ordered listing, such as a worklist, and a count of elements in the worklist. The worklist contains identifiers of primitives or aggregated blocks that have an input change. Each primitive or aggregated block in the worklist can be scheduled to a cluster of processors. This procedure saves the computation required to check for input change. By scheduling actual work in a group the memory bandwidth of the parallel machine is better utilized; the active blocks' memory read requests will be bunched together in time resulting in better utilization of the streaming memory interface. There are two example methods to construct the worklist that are described below.

Build a Worklist Before Executing a Level

Each level can have an array of input change flags for primitives or aggregated blocks that can be set to true if there is an input change. A corresponding array of block identifiers can be stream compacted using array of input change flags as predicates to form a worklist array. A population count of the input change flags can give the work count. Stream compaction is known by those of ordinary skill in the art of simulating circuit designs.

Build a Worklist on the Fly

In another approach, a worklist may be generated on-the-fly. For example, each level may have 1) An array of input change flags for primitives or aggregated blocks which will be set to true if there is an input change.
2) Worklist with a count of elements in the worklist, and an array of elements in the worklist.

Each primitive or aggregated block which has an input change for a successor primitive or aggregated block will add to the worklist using the procedure below. Use atomic Compare and Swap to set the Input change for the Successor and extract the old Input change.

```
if old Input change is False { // Successor is not in the worklist
    // atomically increment worklist count,
    // and get old value of the worklist count
    worklist_oldtail = atomic Increment (worklist_count)
    worklist[worklist_oldtail] = Successor Identifier;
}
```

When all active levels before a level k are complete, level k's worklist count has the number of primitives or aggregated blocks that should be executed, and the worklist array contains the identifiers for the primitives or aggregated blocks in locations 0 to <worklist count>-1.

An alternate procedure for constructing the worklist are to use standard set data structures under a mutually exclusive lock. Set data structures such as HashSet or HashMap maintain a unique set of elements. The lock ensures that only one updater at a time is allowed to update the data structure.

Dynamic Compaction of Active Aggregated Blocks

Building the worklist on-the-fly procedure previously described may be used to improve the memory bandwidth utilization of the parallel machine. The procedure can result in the worklist count and worklist array. Each level execution can operate for the entire count of the total aggregated blocks in the level. Execution of position k in a level:

```
if(K < Worklist_count){
    Execute Aggregated Block corresponding to Worklist[K]
}
```

This procedure can help to ensure that the position 0 thru Worklist_count-1 executes active aggregated blocks, improving memory bandwidth utilization. The aggregated blocks with no activity are skipped but the set of positions being skipped is grouped together at the end.

Scheduling of a Range of Narrow Levels

When a sequence of narrow levels occurs in an execution region it is advantageous to allocate the narrow levels to a single cluster of the parallel machine. The single cluster or group of processors has fast synchronization and low latency local memory. The range of narrow levels is grouped into a single multi level. The multi level will start with first level in the range and will complete after the last level in the range is completed. The multi level saves the cost of launching each individual level and the barrier to wait for completion of a level is more efficient. The multi level can implement static, quasi-dynamic, or dynamic scheduling to the execution of sublevels within. Dynamic scheduling is very efficient due to the availability of fast synchronization and low latency local memory.

Upon reading this disclosure, those of ordinary skill in the art will appreciate still additional alternative simulation methods and systems through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope of this disclosure.

What is claimed is:

1. A method for simulating a circuit design, the method comprising:
   identifying a specified region of a circuit design for manufacturing, the circuit design comprising a set of logic elements having common inputs corresponding to one or more inputs of the specified region of the circuit design;
   identifying one or more inputs of the specified region of the circuit design having a state change;
   selecting a subset of the identified one or more inputs of the specified region of the circuit design that have an input change;
   for each input of the selected subset of the identified one or more inputs of the specified region of the circuit design:
      computing a logic level depth associated with the input, the logic level depth corresponding to a number of logic elements included in a signal path from an input of a first logic element included in the signal path to an input of a register included in the signal path;
   determining a maximum logic level depth of the one or more logic elements coupled to the selected subset of inputs of the identified one or more inputs of the specified region of the circuit design from the computed logic level depths;
   scheduling for simulation, by one or more processors, one or more logic elements coupled to the selected subset of the identified one or more inputs of the specified region of the circuit design; and
   simulating in parallel, in accordance with the scheduled simulation of the simulation range of logic levels, the one or more logic elements coupled to the selected subset of the identified one or more inputs of the specified region of the circuit design.

2. The method of claim 1, further comprising:
   for the one or more logic elements coupled to the selected subset of the identified one or more inputs of the specified region of the circuit design, identifying a reduced simulation range of logic levels scheduled for simulation;
   executing, using the one or more processors, simulation of first level in the reduced simulation range of logic levels, for each logic element of the one or more logic elements coupled to the selected subset of the identified one or more inputs of the specified region of the circuit design; and
   executing, using the one or more processors, simulation of one or more subsequent levels in the reduced simulation range of logic levels, for each logic element of the one or more logic elements coupled to the selected subset of the identified one or more inputs of the specified region of the circuit design.

3. The method of claim 2, wherein the reduced simulation range of logic levels spans three sequential logic level depths.

4. The method of claim 1, wherein the logic element is a primitive.

5. The method of claim 1, wherein the logic element is an aggregated logic block comprising a plurality of primitives.

6. A method for simulating a circuit design, the method comprising:
   receiving information identifying logic elements of the circuit design and state information describing a state of one or more inputs of the logic elements;
   generating and ordered listing of one or more of the logic elements that have state information indicating an input change;
   computing a logic level depth of at least one input of the one or more logic elements included in the ordered listing, the logic level depth corresponding to a number of primitives included in a signal path from an input of a logic element to an input of a register included in the signal path of the input;
   determining a maximum logic level depth of the one or more logic elements included in the ordered listing from the computed logic level depths;
   for the one or more logic elements included in the ordered listing, scheduling for simulation by one or more processors, a simulation range of logic levels, the simulation range comprising a first logic level to a last logic level, the last logic level having a logic level depth corresponding to the determined maximum logic level depth; and
   simulating in parallel, in accordance with a scheduled simulation of the simulation range of logic levels, the one or more logic elements included in the ordered listing.

7. The method of claim 6, further comprising:
   for the one or more logic elements included in the ordered listing, identifying a reduced simulation range of logic levels scheduled for simulation by one or more processors;
   executing, using the one or more processors, simulation of first level in the reduced simulation range of logic levels, for each logic element included in the ordered listing; and
   executing, using the one or more processors, simulation of one or more subsequent levels in the reduced simulation range of logic levels, for each logic element included in the ordered listing of logic elements.

8. The method of claim 7, wherein the reduced simulation range of levels spans three sequential logic level depths.

9. The method of claim 6, wherein the logic element is a primitive.

10. The method of claim 6, wherein the logic element is an aggregated logic block comprising a plurality of primitives.

11. A non-transitory computer-readable storage medium containing computer program code executable by a processor for simulating a circuit design, the code comprising code for:
   identifying a specified region of a circuit design for manufacturing, the circuit design comprising a set of logic elements having common inputs corresponding to one or more inputs of the specified region of the circuit design;
   identifying one or more inputs of the specified region of the circuit design having a state change;
   selecting a subset of the identified one or more inputs of the specified region of the circuit design that have an input change;
   for each input of the selected subset of the identified one or more inputs of the specified region of the circuit design:
      computing a logic level depth associated with the input, the logic level depth corresponding to a number of logic elements included in a signal path from an input of a first logic element included in the signal path to an input of a register included in the signal path;

determining a maximum logic level depth of the one or more logic elements coupled to the selected subset of inputs of the identified one or more inputs of the specified region of the circuit design from the computed logic level depths;

scheduling for simulation, by one or more processors, one or more logic elements coupled to the selected subset of the identified one or more inputs of the specified region of the circuit design; and simulating in parallel, in accordance with the scheduled simulation of the simulation range of logic levels, the one or more logic elements coupled to the selected subset of the identified one or more inputs of the specified region of the circuit design.

12. The non-transitory computer-readable storage medium of claim 11, further comprising code for:

for the one or more logic elements coupled to the selected subset of the identified one or more inputs of the specified region of the circuit design, identifying a reduced simulation range of logic levels scheduled for simulation;

executing, using the one or more processors, simulation of first level in the reduced simulation range of logic levels, for each logic element of the one or more logic elements coupled to the selected subset of the identified one or more inputs of the specified region of the circuit design; and executing, using the one or more processors, simulation of one or more subsequent levels in the reduced simulation range of logic levels, for each logic element of the one or more logic elements coupled to the selected subset of the identified one or more inputs of the specified region of the circuit design.

13. A non-transitory computer-readable storage medium containing computer program code for simulating a circuit design, the code comprising code for:

receiving information identifying logic elements of the circuit design and state information describing a state of one or more inputs of the logic elements;

generating and ordered listing of one or more of the logic elements that have state information indicating an input change;

computing a logic level depth of at least one input of the one or more logic elements included in the ordered listing, the logic level depth corresponding to a number of primitives included in a signal path from an input of a logic element to an input of a register included in the signal path of the input;

determining a maximum logic level depth of the one or more logic elements included in the ordered listing from the computed logic level depths;

for the one or more logic elements included in the ordered listing, scheduling for simulation by one or more processors, a simulation range of logic levels, the simulation range comprising a first logic level to a last logic level, the last logic level having a logic level depth corresponding to the determined maximum logic level depth; and simulating in parallel, in accordance with a schedule for simulation of the simulation range of logic levels, the one or more logic elements included in the ordered listing.

14. The non-transitory computer-readable storage medium of claim 13, further comprising code for:

for the one or more logic elements included in the ordered listing, identifying a reduced simulation range of logic levels scheduled for simulation by one or more processors;

executing, using the one or more processors, simulation of first level in the reduced simulation range of logic levels, for each logic element included in the ordered listing; and executing, using the one or more processors, simulation of one or more subsequent levels in the reduced simulation range of logic levels, for each logic element included in the ordered listing of logic elements.

* * * * *